(12) United States Patent
Kim et al.

(10) Patent No.: US 12,520,480 B2
(45) Date of Patent: Jan. 6, 2026

(54) SEMICONDUCTOR DEVICE HAVING A THREE-DIMENSIONAL STRUCTURE AND METHOD FOR FABRICATING THE SAME

(71) Applicant: SK hynix Inc., Gyeonggi-do (KR)

(72) Inventors: Ji Yeon Kim, Gyeonggi-do (KR); Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 576 days.

(21) Appl. No.: 17/972,211

(22) Filed: Oct. 24, 2022

(65) Prior Publication Data

US 2023/0320067 A1 Oct. 5, 2023

(30) Foreign Application Priority Data

Mar. 31, 2022 (KR) .......................... 10-2022-0040443

(51) Int. Cl.
H10B 12/00 (2023.01)

(52) U.S. Cl.
CPC ............. *H10B 12/30* (2023.02); *H10B 12/03* (2023.02); *H10B 12/05* (2023.02); *H10B 12/482* (2023.02)

(58) Field of Classification Search
CPC ........ H10B 12/30; H10B 12/03; H10B 12/05; H10B 12/482; H10B 12/50; H10B 12/0335; H10B 12/48; H10D 30/6734
USPC ....................................................... 438/239
See application file for complete search history.

(56) References Cited

U.S. PATENT DOCUMENTS

| | | | |
|---|---|---|---|
| 2018/0323199 A1* | 11/2018 | Roberts | H10D 64/518 |
| 2019/0157293 A1* | 5/2019 | Jang | H10D 62/292 |
| 2021/0104527 A1 | 4/2021 | Son | |
| 2021/0183862 A1 | 6/2021 | Son et al. | |
| 2021/0225865 A1* | 7/2021 | Wu | H10B 43/10 |
| 2021/0233779 A1* | 7/2021 | Kang | H01L 21/321 |

FOREIGN PATENT DOCUMENTS

| | | |
|---|---|---|
| KR | 10-2019-0058011 A | 5/2019 |
| KR | 10-2021-0085417 A | 7/2021 |
| KR | 10-2022-0012341 A | 2/2022 |

OTHER PUBLICATIONS

Office Action for Korean Patent Application No. 10-2022-0040443 issued by the Korean Patent Office on Jul. 16, 2025.

* cited by examiner

*Primary Examiner* — Duy T Nguyen
(74) *Attorney, Agent, or Firm* — IP & T GROUP LLP

(57) ABSTRACT

A method for fabricating a semiconductor device includes: forming a stack body over a sacrificial pad; forming a sacrificial vertical structure that passes through the stack body to be coupled to the sacrificial pad; etching the stack body to form vertical openings spaced apart from the sacrificial vertical structure; forming a sacrificial recess that exposes a bottom portion of the sacrificial vertical structure by removing the sacrificial pad; forming an etch stop liner layer that surrounds the bottom portion of the sacrificial vertical structure; and selectively removing the sacrificial vertical structure.

15 Claims, 10 Drawing Sheets

SEMICONDUCTOR DEVICE HAVING A THREE-DIMENSIONAL STRUCTURE AND METHOD FOR FABRICATING THE SAME

CROSS-REFERENCE TO RELATED APPLICATIONS

The present application claims priority of Korean Patent Application No. 10-2022-0040443, filed on Mar. 31, 2022, which is incorporated herein by reference in its entirety.

BACKGROUND

1. Field

Embodiments of the present invention relate to a semiconductor device, and more particularly, to a semiconductor device having a three-dimensional structure and a method for fabricating the same.

2. Description of the Related Art

The size of a memory cell is being continuously reduced to increase the net die of a memory device. As the size of memory cells is miniaturized, it is required to reduce parasitic capacitance Cb and increase the capacitance as well. However, it is difficult to increase the net die due to the structural limitation of the memory cells.

Recently, three-dimensional semiconductor memory devices including memory cells that are arranged in three dimensions are being considered.

SUMMARY

Embodiments of the present invention are directed to a semiconductor device having highly integrated memory cells and a method for fabricating the semiconductor device.

In accordance with an embodiment of the present invention, a method for fabricating a semiconductor device includes: forming a stack body over a sacrificial pad; forming a sacrificial vertical structure that passes through the stack body to be coupled to the sacrificial pad; etching the stack body to form vertical openings spaced apart from the sacrificial vertical structure; forming a sacrificial recess that exposes a bottom portion of the sacrificial vertical structure by removing the sacrificial pad; forming an etch stop liner layer that surrounds the bottom portion of the sacrificial vertical structure; and selectively removing the sacrificial vertical structure.

In accordance with another embodiment of the present invention, a method for fabricating a semiconductor device includes: forming a bit line pad over a substrate; forming a sacrificial pad over the bit line pad; forming a stack body over the sacrificial pad; forming a sacrificial vertical structure that passes through the stack body to be coupled to the sacrificial pad; etching the stack body to form vertical openings spaced apart from the sacrificial vertical structure; forming a sacrificial recess that exposes a bottom portion of the sacrificial vertical structure by removing the sacrificial pad; forming an etch stop liner layer that surrounds the bottom portion of the sacrificial vertical structure; forming a bit line opening by selectively removing the sacrificial vertical structure; expanding the bit line opening to expose the bit line pad; and forming a vertically oriented bit line that fills the expanded bit line opening.

In accordance with yet another embodiment of the present invention, a semiconductor device includes: a substrate; a conductive line pad disposed over the substrate; a bit line contacting and disposed over the conductive line pad; a stack of active layers, a first end of each coupled to the bit line at different vertical positions on the bit line; a stack of capacitors, each including a) a storage node coupled to a second end of one of the active layers opposing the first end, b) a dielectric layer, and c) a plate node; a plate line extending above the substrate and connected to each plate node of the stack of capacitors; a stack of double word lines forming double gates for the active layers, each of the double word lines disposed respectively over and under each of the active layers; and a dielectric pad disposed over the substrate and surrounding a bottom portion of the bit line. The dielectric pad may be disposed at a higher level than the conductive line pad. The plate nodes of the stack of capacitors comprise protrusions extending laterally from the plate line into recesses in storage nodes of the stack of capacitors, and wherein the protrusions are disposed at the vertical positions where the bit line couples to the active layers. The dielectric pad and the conductive line pad extend in a direction above the substrate. The plate line is disposed above the dielectric pad.

DETAILED DESCRIPTION

Figure 1:
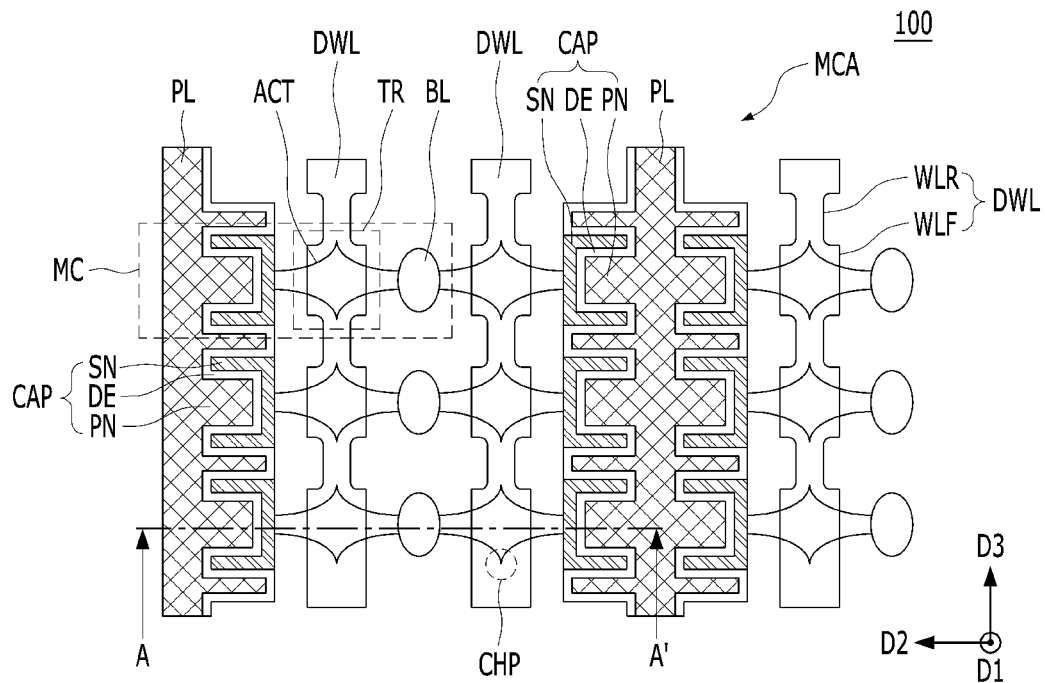
FIG. 1 is a schematic plan view illustrating a semiconductor device in accordance with one embodiment of the present invention.

Embodiments of the present invention will be described below is in more detail with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiments of the present invention, the density of memory cells may be increased and the parasitic capacitance may be reduced by vertically stacking memory cells.

Figure 2:
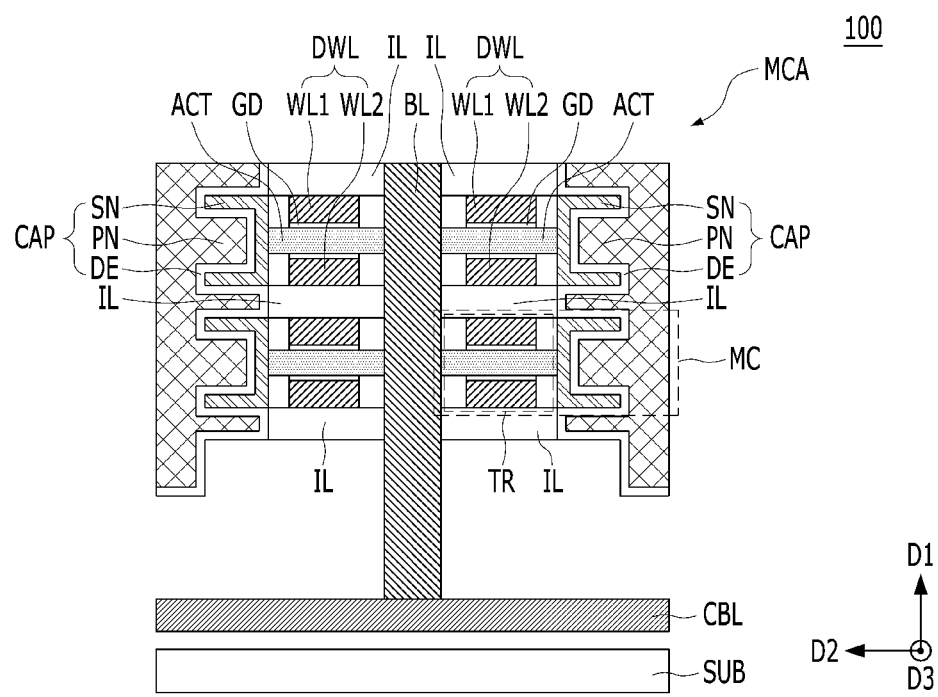
FIG. 2 is a schematic cross-sectional view of the semiconductor device taken along a line A-A' shown in FIG. 1.

FIG. 1 is a schematic plan view illustrating a semiconductor device in accordance with one embodiment of the present invention. FIG. 2 is a schematic cross-sectional view of the semiconductor device taken along a line A-A' shown in FIG. 1.

Referring to FIGS. 1 and 2, the semiconductor device 100 according to one embodiment of the invention may include a lower structure SUB, a conductive line pad CBL, and a memory cell array MCA. The memory cell array MCA may include a plurality of memory cells MC. Cell isolation layers IL may be disposed between the memory cells MC that are stacked in a first direction D1. The cell isolation layers IL may include a dielectric material, such as for example silicon oxide.

An individual memory cell MC may include a transistor TR and a capacitor CAP. The transistor TR may include an active layer ACT and a word line DWL, and the word line DWL may include a double word line structure. The double word line structure of the word line DWL may include a first word line WL1 and a second word line WL2 that are facing each other with the active layer ACT interposed therebetween. The capacitor CAP may include a storage node SN, a dielectric layer DE, and a plate node PN.

The memory cell array MCA may include a bit line BL, active layers ACT, word lines DWL, and capacitors CAP. First sides of the transistors TR may be coupled to the bit line BL, and second sides of the transistors TR may be coupled to the capacitor CAP. In other words, the ends of first sides of the active layers ACT may be commonly coupled to the bit line BL, and the ends of second sides of the active layers ACT may be coupled to the storage nodes SN of the capacitor CAP, respectively.

The bit line BL may extend in a first direction D1 which is away from or perpendicular to the surface of the lower structure SUB. The active layers ACT may extend in a second direction D2 which is above or parallel to the surface of the lower structure SUB. The word lines DWL may extend in a third direction D3 which is parallel to or over the surface of the lower structure SUB. Herein, the first direction D1, the second direction D2, and the third direction D3 may cross each other.

The bit line BL may be vertically oriented in the first direction D1. The bit line BL may be electrically connected to the conductive line pad CBL. The conductive line pad CBL may be referred to as a bit line pad. The bit line BL may be referred to as a vertically aligned bit line or a pillar-type bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack including titanium nitride and tungsten over the titanium nitride.

The active layers ACT may be laterally arranged in the second direction D2 from the bit line BL. The word lines DWL may include a pair of word lines, that is, a first word line WL1 and a second word line WL2. The first word line WL1 and the second word line WL2 may vertically face each other with the active layer ACT interposed therebetween. A gate dielectric layer GD may be formed on upper and lower surfaces of the active layers ACT. Each of the active layers ACT may include a protruding channel CHP. The protruding channel CHP may vertically overlap with the word line DWL. While shown as a double word line structure in FIGS. 1 and 3, the present invention is not limited to having double world lines and include three-dimensional memory cells with stacked single word line structures.

The active layers ACT may include a semiconductor material or an oxide semiconductor material. For example, the active layers ACT may include monocrystalline silicon, germanium, silicon germanium, or indium gallium zinc oxide (IGZO).

The transistor TR may be a cell transistor and may have a word line DWL. In the word line DWL, the first word line WL1 and the second word line WL2 may have the same potential. For example, the first word line WL1 and the second word line WL2 may form a pair, and the same word line driving voltage may be applied to the first word line WL1 and the second word line WL2. As described, the memory cell MC according to one embodiment of the present invention may have a word line DWL in which two first and second word lines WL1 and WL2 are disposed adjacent to one active layer ACT.

According to another embodiment of the present invention, the first word line WL1 and the second word line WL2 may have different potentials. For example, a word line driving voltage may be applied to the first word line WL1, and a ground voltage may be applied to the second word line WL2. The second word line WL2 may be referred to as a back word line or a shield word line. According to another embodiment of the present invention, the ground voltage may be applied to the first word line WL1, and the word line driving voltage may be applied to the second word line WL2.

From the perspective of a top view shown in FIG. 1, the word line DWL may include two notch-type sidewalls. Each of the notch-type sidewalls may include a plurality of flat surfaces WLF and a plurality of recessed surfaces WLR. The flat surfaces WLF and the recessed surfaces WLR may be alternately repeated in the third direction D3. The flat surfaces WLF may be disposed adjacent to the bit line BL and the storage node SN.

The gate dielectric layer GD may include silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

The first and second word lines WL1 and WL2 of the word line DWL may include a metal, a metal mixture, a metal alloy, or a semiconductor material. The word line DWL may include titanium nitride, tungsten, polysilicon, or a combination thereof. For example, the first and second word lines WL1 and WL2 may include a TiN/W stack in which titanium nitride and tungsten are sequentially stacked. The first and second word lines WL1 and WL2 may include an N-type work function material or a P-type work function material. The N-type work function material may have a low work function of approximately 4.5 eV or less, and the P-type work function material may have a high work function of approximately 4.5 eV or more.

The capacitor CAP may be disposed laterally from the transistor TR. The capacitor CAP may include a storage node SN that extends laterally from the active layers ACT. The capacitor CAP may further include a dielectric layer DE and a plate node PN over the storage node SN. The storage node SN, the dielectric layer DE, and the plate node PN may be arranged laterally. The storage node SN may have a laterally oriented cylindrical shape. The dielectric layer DE may conformally cover the cylindrical inner wall of the storage node SN. The dielectric layer DE may conformally cover the cylindrical inner wall and the cylindrical outer wall of the storage node SN. The plate node PN may cover the cylindrical inner wall and the cylindrical outer wall of the storage node SN over the dielectric layer DE.

The storage node SN may have a three-dimensional structure, and the storage node SN of the three-dimensional structure may have a lateral three-dimensional structure which is oriented in the second direction D2. As an example of the three-dimensional structure, the storage node SN may have a cylindrical shape. According to another embodiment of the present invention, the storage node SN may have a pillar shape or a pylinder shape. The pylinder shape may refer to a structure in which a pillar shape and a cylindrical shape are merged.

The plate nodes PN of the capacitors CAP may be commonly coupled to the plate line PL. The plate line PL may not be coupled to the conductive line pad CBL.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN over the titanium nitride, and titanium nitride (TiN) may serve as a plate node PN of a capacitor CAP, and tungsten nitride may be a low-resistance material.

The dielectric layer DE may be referred to as a capacitor dielectric layer. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a is zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, it may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material.

According to another embodiment of the present invention, an interface control layer for improving leakage current may be further formed between the storage node SN and the dielectric layer DE. The interface control layer may include titanium oxide ($TiO_2$), niobium oxide, or niobium nitride. The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with another data storage material. For example, the data storage material may be a phase change material, a magnetic tunnel junction (MTJ), or a variable resistance material.

The memory cell array MCA may include a plurality of memory cells MC, wherein each memory cell MC includes a vertically oriented bit line BL, a laterally oriented active layer ACT, a laterally oriented word line DWL, and a capacitor CAP.

The active layers ACT disposed adjacent to each other in the first direction D1 may contact one bit line BL. Active layers ACT disposed adjacent to each other in the third direction D3 may share one word line DWL. The capacitors CAP may be coupled to the active layers ACT, respectively.

In the memory cell array MCA, a plurality of word lines DWL may be vertically stacked in the first direction D1. Each of the word lines DWL may include a pair of a first word line WL1 and a second word line WL2. Between the first word line WL1 and the second word line WL2, a plurality of active layers ACT may be arranged laterally to be spaced apart from each other in the third direction D3.

The lower structure SUB may be a material appropriate for semiconductor processing. The lower structure SUB may include at least one of conductive material, a dielectric material, and a semiconductor material. The lower structure SUB may include a semiconductor substrate, and the semiconductor substrate may be formed of a material containing silicon. The lower structure SUB may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The lower structure SUB may include another semiconductor material, such as germanium. The lower structure SUB may include a III/V-group semiconductor substrate, for example, a compound semiconductor substrate, such as GaAs.

According to another embodiment of the present invention, the lower structure SUB may further include a peripheral circuit portion. According to another embodiment of the present invention, the peripheral circuit portion may be disposed over the lower structure SUB. The peripheral circuit portion may be disposed at a lower level than the memory cell array MCA. This may be referred to as a COP (Cell over PERI) structure. The peripheral circuit portion may include at least one control circuit for driving the memory cell array MCA. The at least one control circuit of the peripheral circuit portion may include an N-channel transistor, a P-channel transistor, a CMOS circuit, or a combination thereof. The at least one control circuit of the peripheral circuit portion PERI may include an address decoder circuit, a read circuit, a write circuit, and the like. The at least one control circuit of the peripheral circuit portion may include a planar channel transistor, a recess channel transistor, a buried gate transistor, a fin channel transistor (FinFET), etc.

For example, the peripheral circuit portion may include sub-word line drivers and a sense amplifier. The word lines DWL may be coupled to sub-word line drivers, and the bit lines BL may be coupled to the sense amplifier. An interconnection structure, such as a multi-level metal, may be disposed between the peripheral circuit portion and the memory cell array MCA.

According to another embodiment of the present invention, the peripheral circuit portion may be disposed at a higher level than the memory cell array MCA. This may be referred to as a POC (PERI over Cell) structure.

FIGS. 3 to 19 are cross-sectional views illustrating a method for fabricating a semiconductor device in accordance with various embodiments of the present invention.

Figure 3:
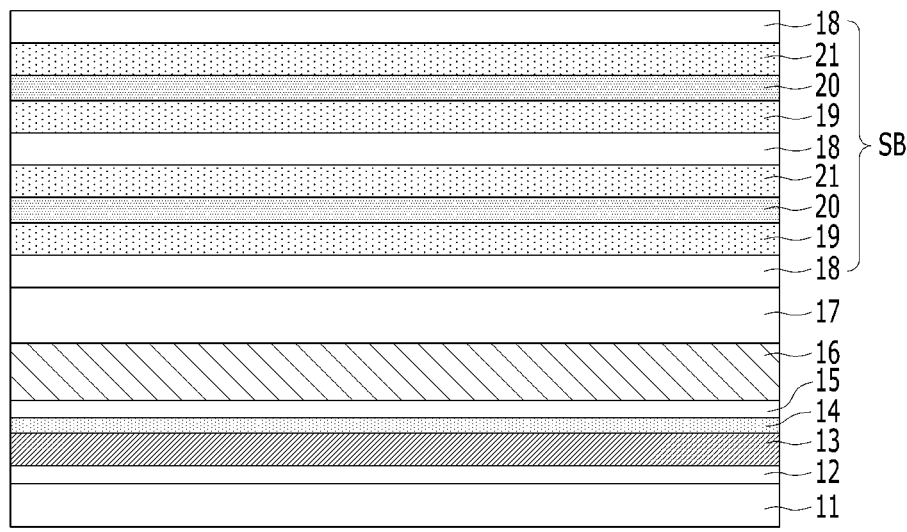
FIGS. 3 to 19 are cross-sectional views illustrating a method for fabricating a semiconductor device in accordance with various embodiments of the present invention.

Referring to FIG. 3, a buffer layer 12 may be formed over a substrate 11. The buffer layer 12 may include a dielectric material. The buffer layer 12 may include silicon oxide. The substrate 11 may include a semiconductor substrate.

A conductive line pad 13 may be formed over the buffer layer 12. The conductive line pad 13 may include a conductive material. For example, the conductive line pad 13 may include a metal-based material. The conductive line pad 13 may include tungsten, titanium nitride, or a combination thereof.

An etch stop layer 14 may be formed over the conductive line pad 13. The etch stop layer 14 may include a dielectric material. The etch stop layer 14 may include silicon nitride.

A first inter-layer dielectric layer 15 may be formed over the etch stop layer 14. The first inter-layer dielectric layer 15 may include silicon oxide.

A sacrificial pad 16 may be formed over the first inter-layer dielectric layer 15. The sacrificial pad 16 may include a metal-based material. The sacrificial pad 16 may include tungsten, titanium nitride, or a combination thereof. The sacrificial pad 16 may include a metallic pad.

The sacrificial pad 16 may serve as an etch stop layer during a subsequent etch process.

A second inter-layer dielectric layer 17 may be formed over the sacrificial pad 16. The second inter-layer dielectric layer 17 may include silicon oxide.

A stack body SB may be formed over the second inter-layer dielectric layer 17. The stack body SB may include a sub-stack in which a cell isolation layer 18, a first sacrificial layer 19, a semiconductor layer 20, and a second sacrificial layer 21 are stacked in order as shown in FIG. 3. The stack body SB may be formed by repeatedly stacking a plurality of the sub-stacks. An uppermost cell isolation layer 18 may be formed on top of the stack body SB. The uppermost cell isolation layer 18 may be thicker than the other cell isolation layers 18. The stack body SB may include a plurality of cell isolation layers 18, a plurality of first sacrificial layers 19, a plurality of semiconductor layers 20, and a plurality of second sacrificial layers 21. The stack body SB may have a structure in which a triple layer of the first sacrificial layer 19/the semiconductor layer 20/the second sacrificial layer 21 is disposed between the cell isolation layers 18.

The cell isolation layers 18 and the uppermost cell isolation layer 18 may include silicon oxide. The first and second sacrificial layers 19 and 21 may include silicon nitride. The semiconductor layers 20 may include a semiconductor material, for example, silicon, monocrystalline silicon, polysilicon, silicon germanium, an oxide semiconductor material, or a combination thereof.

The stack body SB may be formed by stacking a first silicon oxide, a first silicon nitride, a semiconductor material, a second silicon nitride, and a second silicon oxide in this order. The first silicon oxide and the second silicon oxide may correspond to the cell isolation layer 18, and the first silicon nitride and the second silicon nitride may correspond to the first sacrificial layer 19 and the second sacrificial layer 21, respectively. The semiconductor material may correspond to the semiconductor layer 20.

Figure 4:
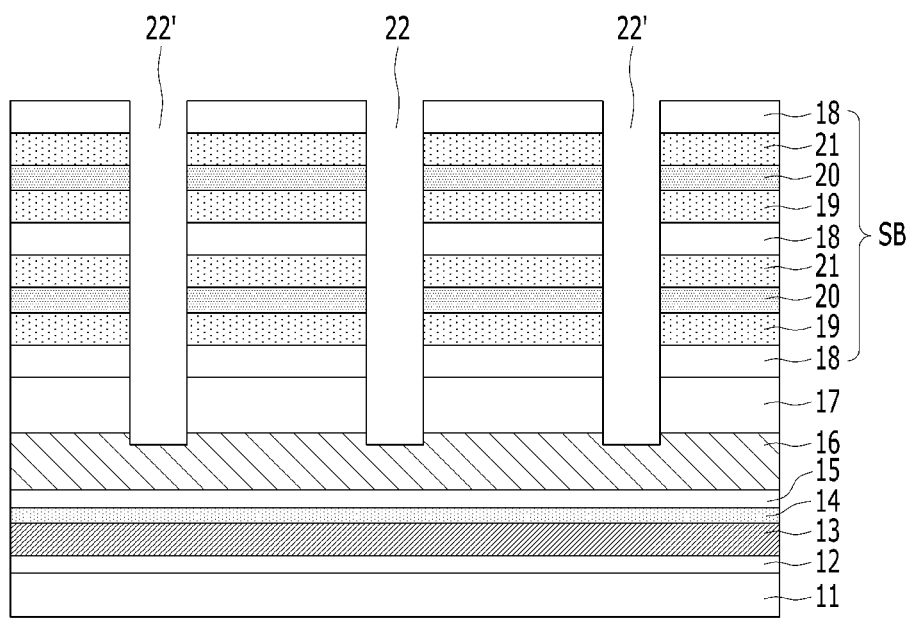

Referring to FIG. 4, a first vertical opening 22 and a second vertical opening 22' passing through a first portion of the stack body SB may be formed. The first and second vertical openings 22 and 22' may extend through the second inter-layer dielectric layer 17 to expose the sacrificial pad 16. In other words, the first and second vertical openings 22 and 22' may penetrate the stack body SB and the second inter-layer dielectric layer 17. The stack body SB and the second inter-layer dielectric layer 17 may be sequentially etched to form the first and second vertical openings 22 and 22'. An etching process for forming the first and second vertical openings 22 and 22' may stop at the sacrificial pad 16.

Figure 5:
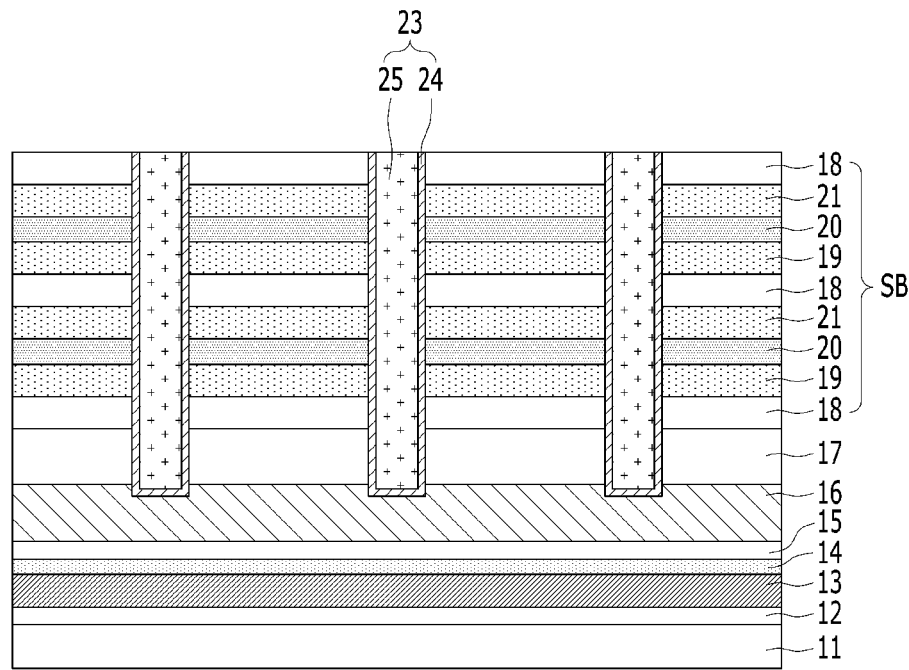

Referring to FIG. 5, sacrificial vertical structures 23 may be formed to fill the first and second vertical openings 22 and 22'. The forming of the sacrificial vertical structures 23 may include depositing and planarizing a dielectric material to fill the first and second vertical openings 22 and 22'. The sacrificial vertical structures 23 may include silicon oxide, silicon nitride, silicon carbon oxide, or a combination thereof. For example, the sacrificial vertical structures 23 may include a silicon nitride liner 24 and a silicon oxide layer 25.

Figure 6:
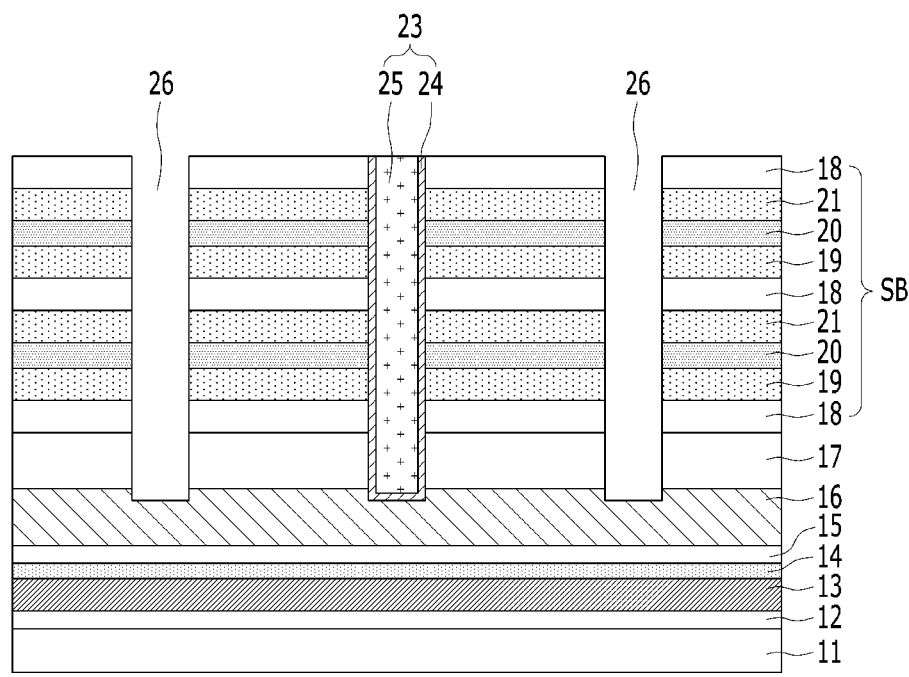

Referring to FIG. 6, two of the sacrificial vertical structures 23 may be removed to form third vertical openings 26.

For example, the sacrificial vertical structures 23 may be removed from the second vertical openings 22'. The third vertical openings 26 may be the second vertical openings 22' exposed again.

Figure 7:
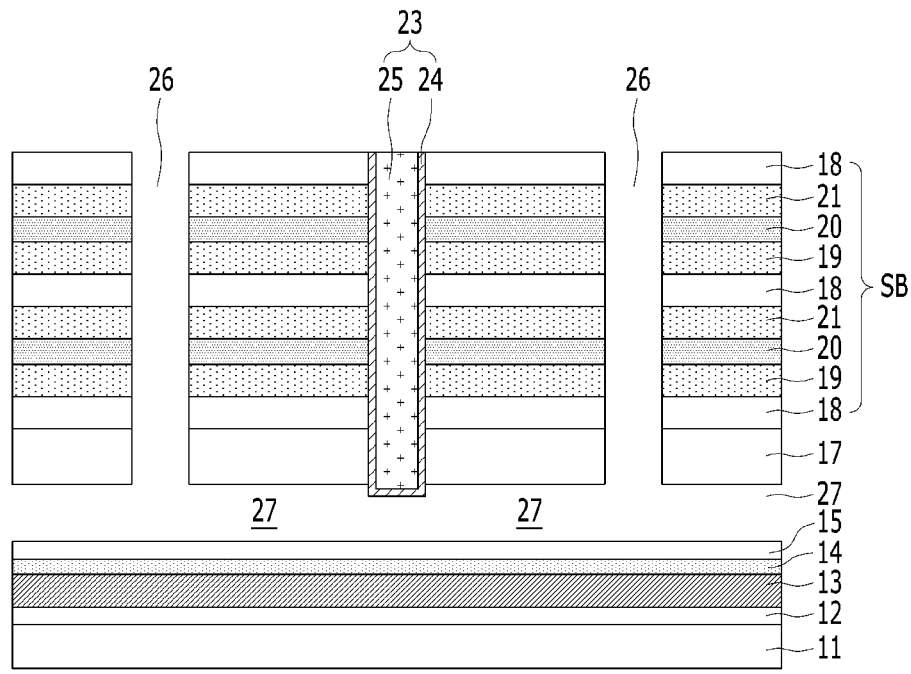

Referring to FIG. 7, the sacrificial pad 16 below the third vertical openings 26 may be partially removed in an area underneath and around the vertical openings 26, with some of the sacrificial pad material remaining to support the stack SB. The sacrificial pad 16 may be removed through a dry etching process or a wet etching process. The space from which the sacrificial pad 16 is removed may be a lateral level recess 27. The lateral level recess 27 may be disposed between the second inter-layer dielectric layer 17 and the first inter-layer dielectric layer 15.

Figure 8:
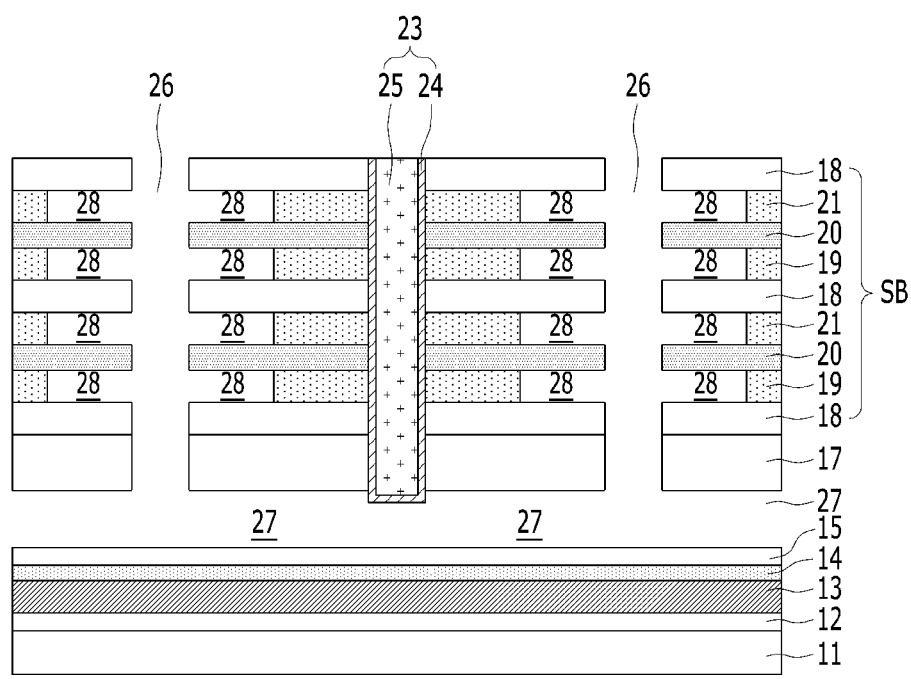

Referring to FIG. 8, the first and second sacrificial layers 19 and 21 may be partially removed through the third vertical opening 26. As a result, a pair of sacrificial layer level recesses 28 may be formed with the semiconductor layer 20 interposed therebetween.

Figure 9:
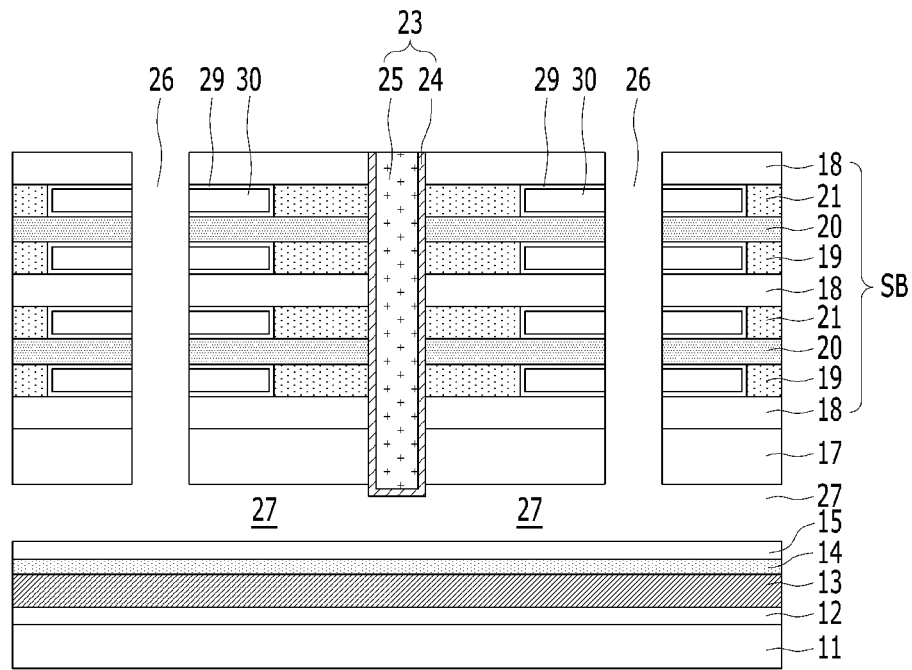

Referring to FIG. 9, a first liner layer 29 and a second liner layer 30 filling the sacrificial layer level recesses 28 may be sequentially formed. The first liner layer 29 may conformally cover the surfaces of the sacrificial layer level recesses 28. The second liner layer 30 may fill the sacrificial layer level recesses 28 over the first liner layer 29. Subsequently, the first liner layer 29 and the second liner layer 30 may be etched to expose the third vertical opening 26 and the lateral level recess 27. The first liner layer 29 and the second liner layer 30 may not fill the third vertical openings 26 and the lateral level recess 27.

Figure 10:
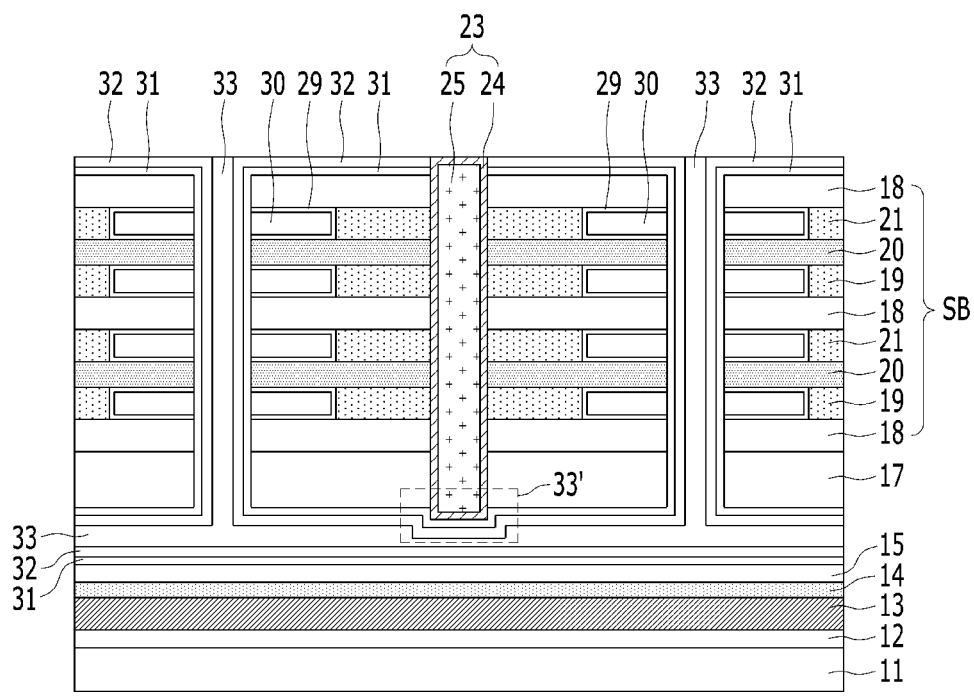

Referring to FIG. 10, the etch stop liner layer 31, the sacrificial liner layer 32, and the sacrificial gap-fill layer 33 may be sequentially formed. The etch stop liner layer 31 may have a high selectivity permitting the sacrificial vertical structure 23 to be removed. The etch stop liner layer 31 may include polysilicon. The etch stop liner layer 31 may include a polysilicon liner. The sacrificial liner layer 32 may include silicon nitride. The sacrificial gap-fill layer 33 may fill the third vertical openings 26 over the sacrificial liner layer 32. The etch stop liner layer 31, the sacrificial liner layer 32, and the sacrificial gap-fill layer 33 may fill the lateral level recess 27.

To access region 33' shown in FIG. 10, the bottom portion of the sacrificial vertical structure 23 may directly contact the etch stop liner layer 31. The etch stop liner layer 31 may have a shape surrounding the bottom portion of the sacrificial vertical structure 23.

The sacrificial gap-fill layer 33 may be planarized to expose the uppermost surface of the sacrificial liner layer 32.

Figure 11:
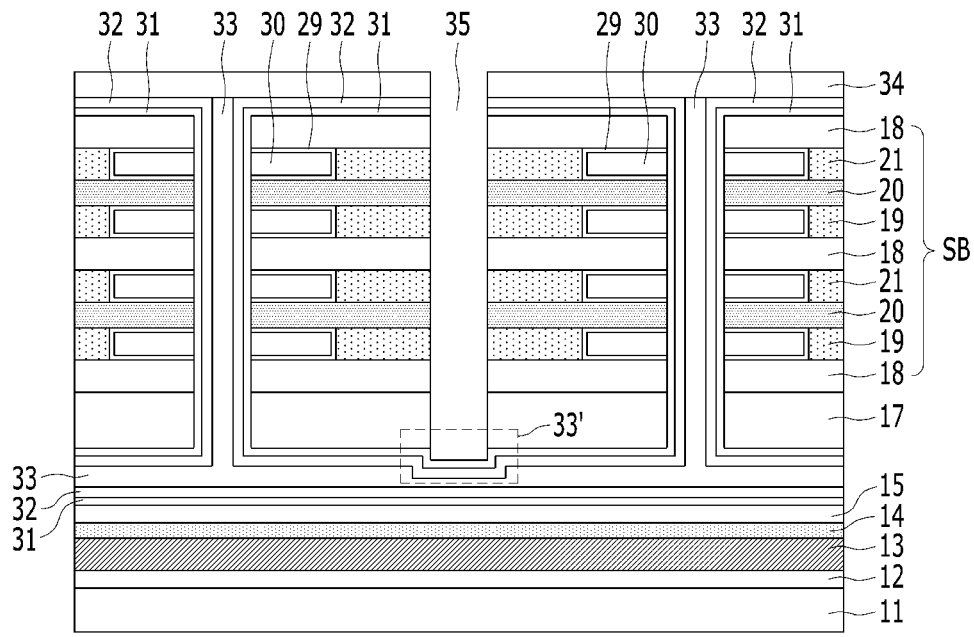

Referring to FIG. 11, a hard mask pattern 34 covering the uppermost surface of the sacrificial liner layer 32 and the exposed surface of the sacrificial gap-fill layer 33 may be formed.

Subsequently, the sacrificial vertical structure 23 may be etched using the hard mask pattern 34. For example, the silicon oxide 25 and the silicon nitride liner 24 may be sequentially removed. The sacrificial vertical structure 23 may be removed to form a bit line opening 35.

The sacrificial vertical structure 23 may be removed by a dry etching process or a wet etching process to form a bit line opening 35. During the etching process for removing the sacrificial vertical structure 23, the etching process may stop at the etch stop liner layer 31 as indicated at region 33'.

The etch stop liner layer 31 may prevent the etching of the surrounding structures while the sacrificial vertical structure 23 is removed. For example, the etching of the sacrificial liner layer 32 and the sacrificial gap-fill layer 33 may be prevented.

As a comparative example, when the etch stop liner layer 31 is omitted, the sacrificial liner layer 32 and the sacrificial gap-fill layer 33 may be consumed while the sacrificial vertical structure 23 is removed.

Figure 12:
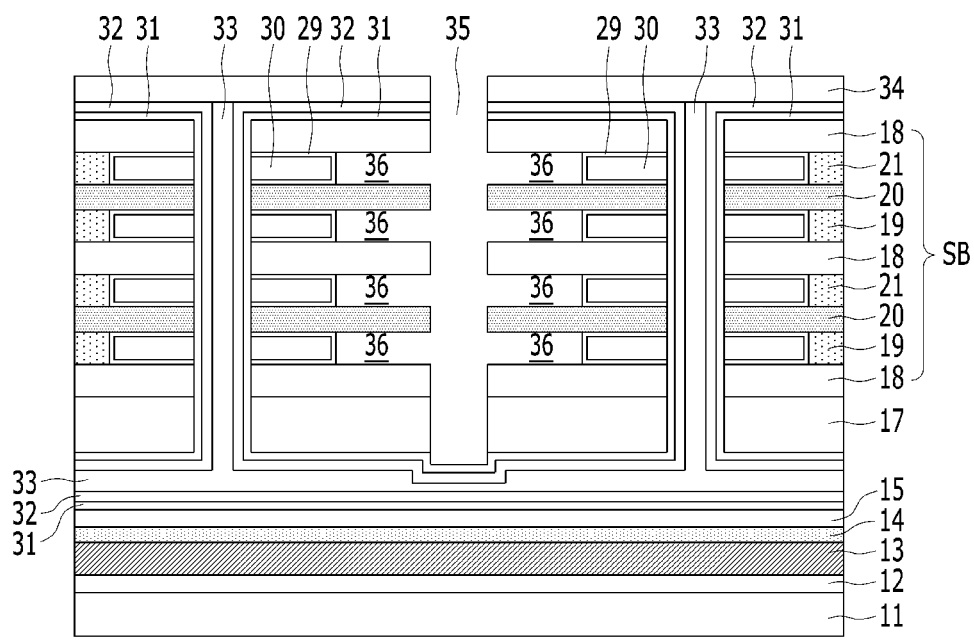
Figure 13:
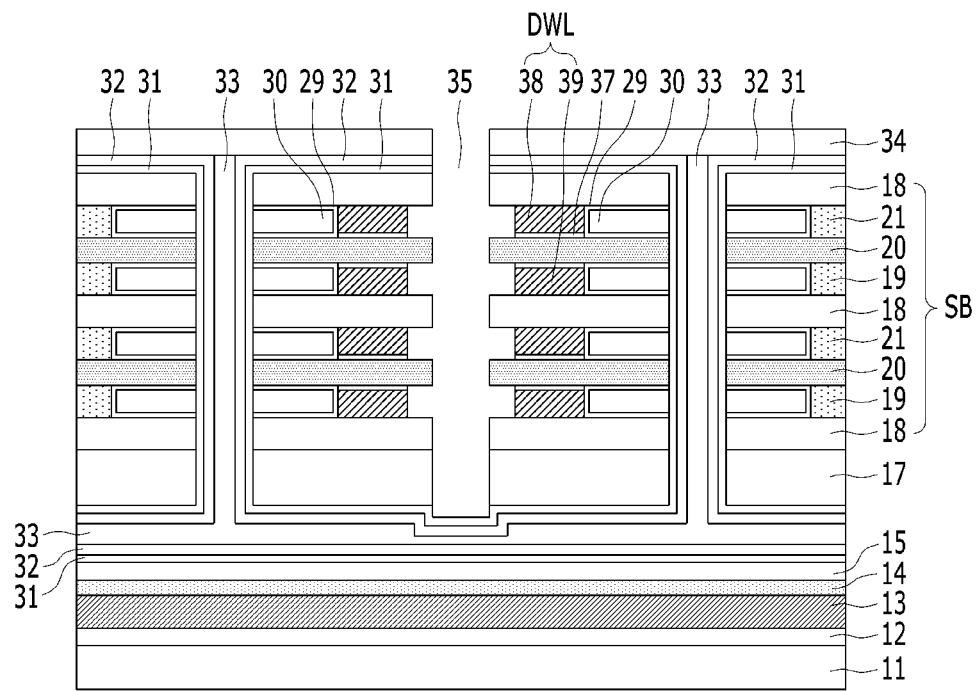

After the bit line opening 35 is formed, a process of replacing portions of the stack body SB with laterally oriented conductive lines, that is, the word lines DWL, may be performed as illustrated in FIGS. 12 and 13.

Referring to FIG. 12, the remaining first and second sacrificial layers 19 and 21 may be removed to form word line level recesses 36 through the bit line opening 35. As the first and second sacrificial layers 19 and 21 are removed, a pair of word line level recesses 36 may be formed with the semiconductor layer 20 interposed therebetween.

Referring to FIG. 13, a gate dielectric layer 37 may be formed over the exposed portion of the semiconductor layers 20. The gate dielectric layer 37 may be selectively formed on the surfaces of the semiconductor layer 20 by an oxidation process. According to another embodiment of the present invention, the gate dielectric layer 37 may be formed by a deposition process, and in this case, the gate dielectric layer 37 may be formed on the surface of the word line level recesses 36 and on the surface of the semiconductor layers 20.

Subsequently, a word line DWL having a double word line structure may be formed by filling each of the word line level recesses 36 with a conductive material. The word line DWL may include polysilicon, titanium nitride, tungsten, or a combination thereof. For example, the forming of the word line DWL may include conformally depositing titanium nitride, depositing tungsten over the titanium nitride to fill the word line level recesses 36, and etching back the titanium nitride and the tungsten. The word line DWL may partially fill the word line level recesses 36, and thus a portion of the gate dielectric layer 37 may be exposed. The word line DWL may include a pair of a first word line 38 and a second word line 39 that are perpendicularly facing each other with the semiconductor layers 20 interposed therebetween. The end of the first sides of the semiconductor layers 20 may be exposed while the word line DWL is formed or after the word line DWL is formed.

Figure 14:
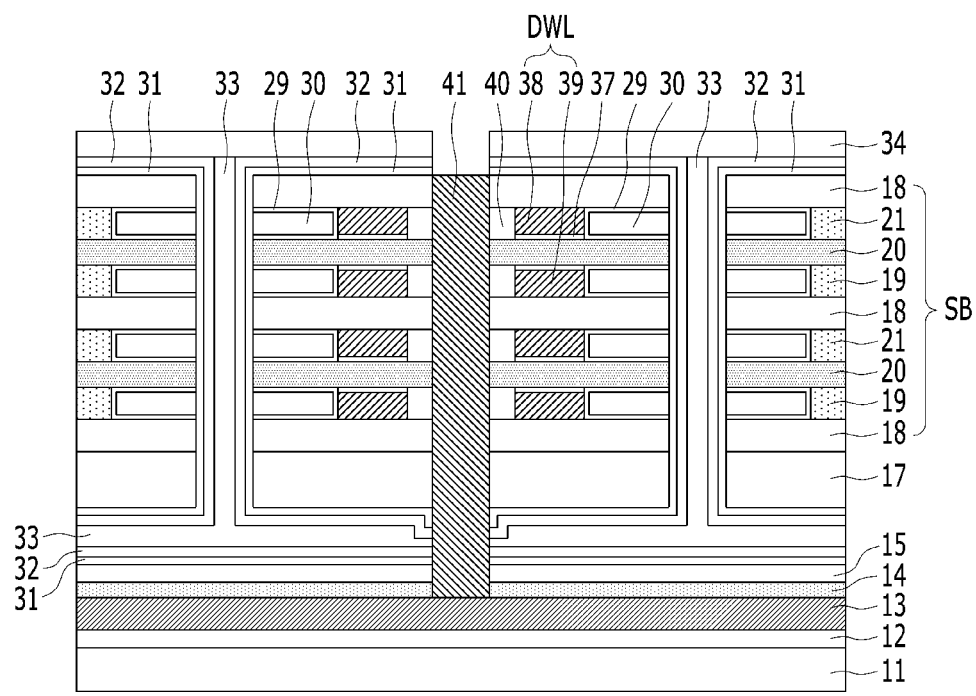

Referring to FIG. 14, bit line-side capping layers 40 in contact with a first side of the word line DWL may be formed. The bit line-side capping layers 40 may be disposed in the word line level recesses 36. The bit line-side capping layers 40 may include silicon oxide or silicon nitride.

Subsequently, the etch stop liner layer 31, the sacrificial liner layer 32, the sacrificial gap-fill layer 33, the first inter-layer dielectric layer 15, and the etch stopper layer 14 below the bit line opening 35 may be sequentially etched. Accordingly, the bit line opening 35 may extend vertically to expose the conductive line pad 13.

Subsequently, a vertically oriented conductive line may be formed. Herein, the vertically oriented conductive line may include a bit line 41 filling the bit line opening 35. The bit line 41 may have a pillar shape that fills the bit line opening 35. The bit line 41 may include titanium nitride, tungsten, or a combination thereof.

The bit line 41 may be coupled to the conductive line pad 13.

After the bit line 41 is formed, a process of replacing portions of the stack body SB with capacitors may be performed as illustrated in FIGS. 15 to 19.

Figure 15:
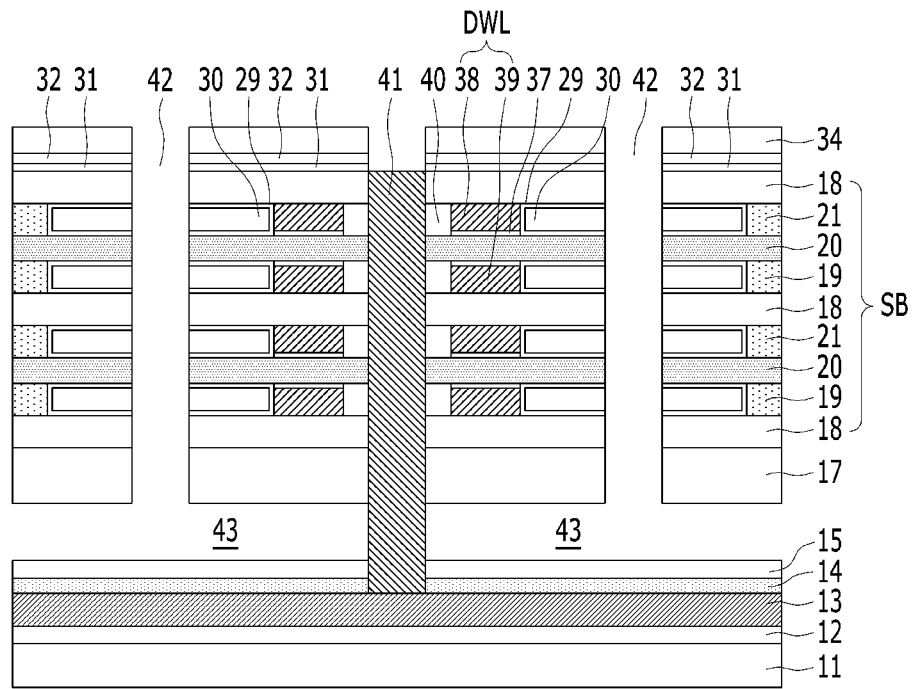

Referring to FIG. 15, fourth vertical openings 42 may be formed. In order to form the fourth vertical openings 42, the sacrificial gap-fill layer 33 and the sacrificial liner layer 32 may be removed using the etch stop liner layer 31 as an etch barrier. The etch stop liner layer 31 may prevent etching of the surrounding structures while the sacrificial gap-fill layer 33 and the sacrificial liner layer 32 are removed. For example, etching of the first liner layer 29 and the second liner layer 30 may be prevented.

Also, the etch stop liner layer 31 may prevent the bottom portion of the bit line 41 from being etched while the sacrificial gap-fill layer 33 and the sacrificial liner layer 32 are removed.

After the sacrificial gap-fill layer 33 and the sacrificial liner layer 32 are removed, the etch stop liner layer 31 may be removed.

The ends of the second sides of the semiconductor layers 20 may be exposed by the fourth vertical openings 42 shown in FIG. 15. A stack of the first liner layer 29 and the second liner layer 30 may remain between the cell isolation layers 18 and the semiconductor layers 20.

As the etch stop liner layer 31, the sacrificial liner layer 32, and the sacrificial gap-fill layer 33 are removed, a pad-type recess 43 extending from the fourth vertical openings 42 may be formed between the first inter-layer dielectric layer 15 and the second inter-layer dielectric layer 17. The bottom portion of the bit line 41 may be exposed by the pad-type recess 43. The pad-type recess 43 may surround the bottom portion of the bit line 41. The etch stop liner layer 31, the sacrificial liner layer 32, and the sacrificial gap-fill layer 33 may not remain in the bottom portion of the bit line 41.

Figure 16:
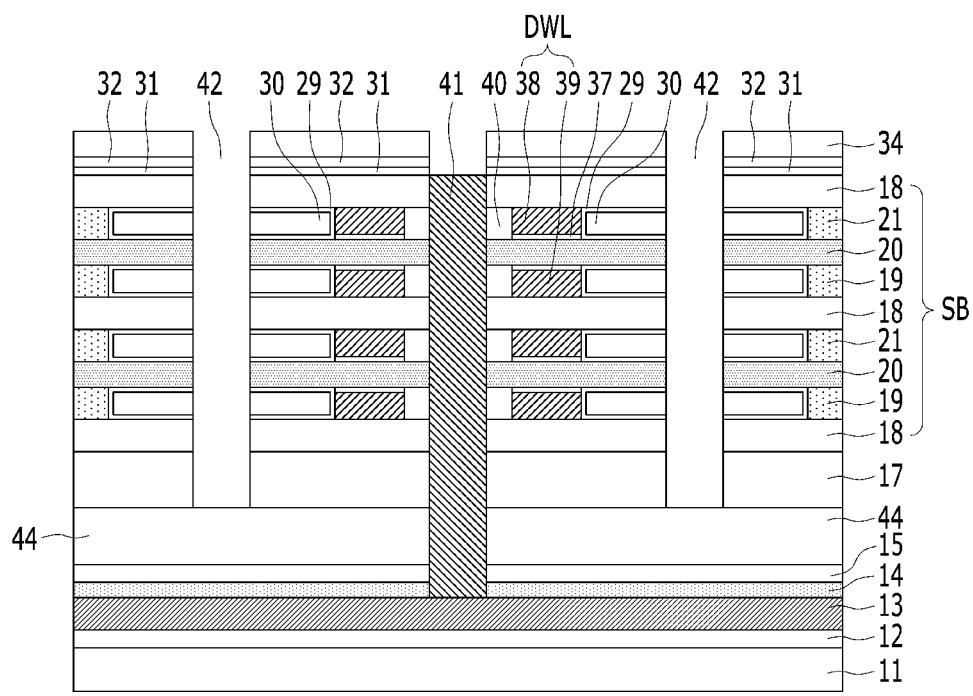

Referring to FIG. 16, a dielectric pad 44 filling the pad-type recess 43 may be formed. The dielectric pad 44 may include silicon oxide. The dielectric pad 44 may not fill the fourth vertical openings 42. The dielectric pad 44 may surround the bottom portion of the bit line 41.

Figure 17:
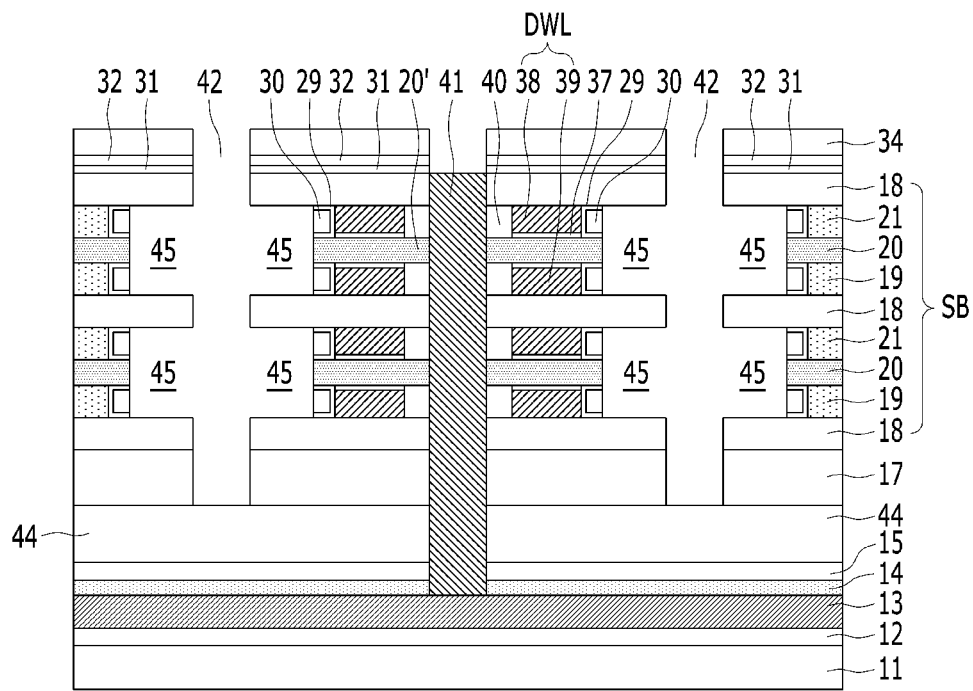

Referring to FIG. 17, the first liner layer 29 and the second liner layer 30 may be laterally recessed through the fourth vertical openings 42. Subsequently, the semiconductor layers 20 may be cut, and thus the active layers 20' may be formed.

As described above, as a result of the recess process of the first liner layer 29 and the second liner layer 30 and the cutting process of the semiconductor layers 20, capacitor openings 45 and active layers 20' may be formed. The first and second word lines 38 and 39 may be disposed with an active layer 20' interposed therebetween. A first side of the active layer 20' may be coupled to the bit line 41.

Figure 18:
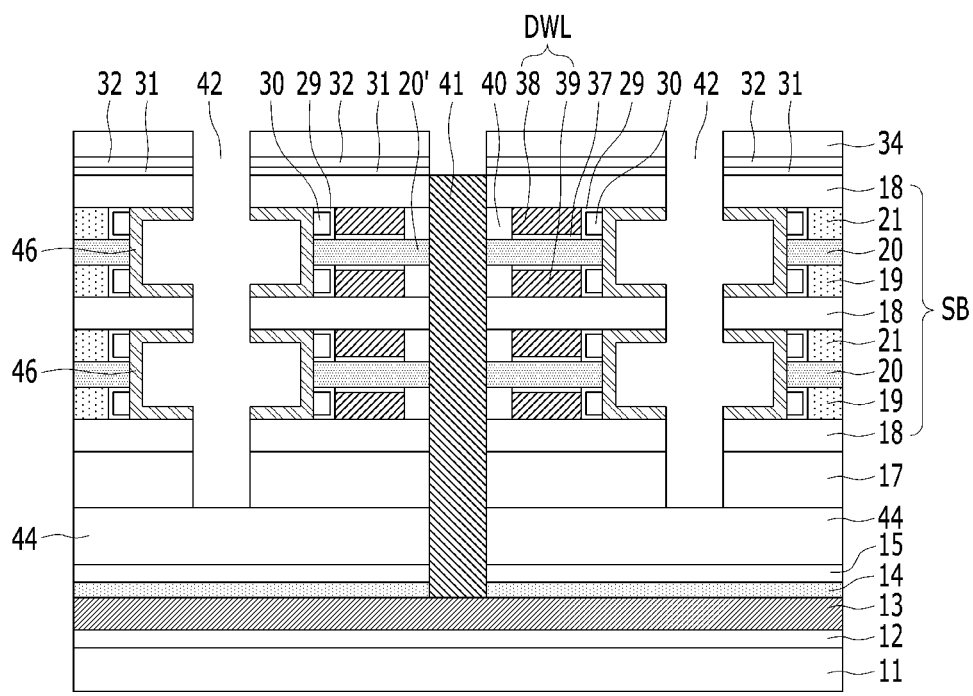

Referring to FIG. 18, a storage node 46 coupled to a second side of the active layer 20' may be formed. To form the storage node 46, a conductive material deposition process and an etch-back process may be performed. The storage node 46 may include titanium nitride. The storage node 46 may have a shape of a laterally oriented cylinder. The storage node 46 may be formed independently within the capacitor opening 45.

Figure 19:
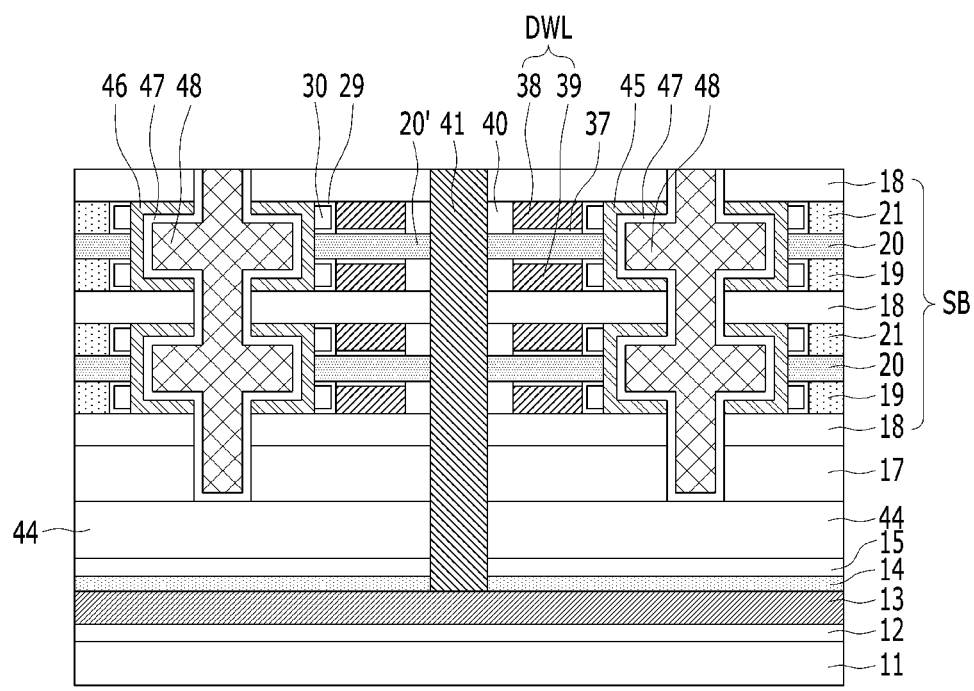

Referring to FIG. 19, a dielectric layer 47 and a plate node 48 may be sequentially formed over the storage node 46. The forming of the plate node 48 may include depositing a conductive layer over the dielectric layer 47 to fill the capacitor opening 45 and the second vertical openings 42, and planarizing the conductive layer until the uppermost cell isolation layer 18 is exposed. During the planarization process for forming the plate node 48, the etch stop liner layer 31, the sacrificial liner layer 32, and the hard mask pattern 34 remaining on the uppermost cell isolation layer 18 may be removed.

According to another embodiment of the present invention, the capacitor forming process as illustrated in FIGS. 15 to 19 may be performed first, and then the word line DWL and the bit line 41 as illustrated in FIGS. 11 to 14 may be formed.

The semiconductor device illustrated in FIGS. 3 to 19 may include the conductive line pad 13, the bit line 41 vertically oriented over the conductive line pad 13, the active layer 20' laterally oriented from the bit line 41, the capacitor including a storage node 46 which is coupled to the active layer 20', and the first and second word lines 38 and 39 laterally oriented to intersect with the active layer 20' in the upper and lower portions of the active layer 20', and the semiconductor device may further include the dielectric pad 44 surrounding the bottom portion of the bit line 41. The dielectric pad 44 may be disposed at a higher level than the conductive line pad 13. The dielectric pad 44 and the conductive line pad 13 may extend in a direction which is parallel to (or above) the upper surface of the substrate 11. The capacitor may include the storage node 46, the dielectric layer 47 and the plate node 48. The etch stopper layer 14 may be disposed over the conductive line pad 13.

According to one embodiment of the present invention, as an etch stop liner layer is formed, the surrounding structures may be prevented from being etched while a sacrificial vertical structure is removed.

While the present invention has been described with respect to the specific embodiments, it will be apparent to those skilled in the art that various changes and modifications may be made without departing from the spirit and scope of the invention described herein.

What is claimed is:

1. A method for fabricating a semiconductor device, comprising:
    forming a stack body over a sacrificial pad;
    forming a sacrificial vertical structure that passes through the stack body to be coupled to the sacrificial pad;
    etching the stack body to form vertical openings spaced apart from the sacrificial vertical structure;
    forming a sacrificial recess that exposes a bottom portion of the sacrificial vertical structure by removing the sacrificial pad;
    forming a first etch stop liner layer that surrounds sidewalls of the etched stack body and a second etch stop liner layer that surrounds the bottom portion of the sacrificial vertical structure after forming the sacrificial recess; and
    selectively removing the sacrificial vertical structure,
    wherein the second etch stop liner layer serves as an etch stop layer during the selectively removing of the sacrificial vertical structure.

2. The method of claim 1, wherein the first and second etch stop liner layers include polysilicon.

3. The method of claim 1, wherein the sacrificial vertical structure includes silicon oxide, silicon nitride, or a combination thereof.

4. The method of claim 1, wherein the stack body includes a dielectric layer, a semiconductor layer, or a combination thereof.

5. The method of claim 1, wherein the stack body includes a first silicon oxide, a first silicon nitride, a semiconductor layer, a second silicon nitride, and a second silicon oxide that are stacked in order.

6. The method of claim 1, further comprising:
    after the removing of the sacrificial vertical structure, forming a vertically oriented conductive line to fill a space from which the sacrificial vertical structure was removed; and removing the first and second etch stop liner layers.

7. A method for fabricating a semiconductor device, comprising:

forming a bit line pad over a substrate;

forming a sacrificial pad over the bit line pad;

forming a stack body over the sacrificial pad;

forming a sacrificial vertical structure that passes through the stack body to be coupled to the sacrificial pad;

etching the stack body to form vertical openings spaced apart from the sacrificial vertical structure;

forming a sacrificial recess that exposes a bottom portion of the sacrificial vertical structure by removing the sacrificial pad;

forming a first etch stop liner layer that surrounds sidewalls of the etched stack body and a second etch stop liner layer that surrounds the bottom portion of the sacrificial vertical structure after forming the sacrificial recess;

forming a bit line opening by selectively removing the sacrificial vertical structure;

expanding the bit line opening to expose the bit line pad by etching some portion of the etch stop liner layer; and forming a vertically oriented bit line that fills the expanded bit line opening, wherein the second etch stop liner layer serves as an etch stop layer during the selectively removing of the sacrificial vertical structure.

8. The method of claim 7, wherein the first and second etch stop liner layers include polysilicon.

9. The method of claim 7, wherein the sacrificial vertical structure includes silicon oxide, silicon nitride, or a combination thereof.

10. The method of claim 7, wherein the stack body includes a dielectric layer, a semiconductor layer, or a combination thereof.

11. The method of claim 7, wherein the stack body includes a first silicon oxide, a first silicon nitride, a semiconductor layer, a second silicon nitride, and a second silicon oxide that are stacked in order.

12. The method of claim 7, further comprising:

removing the first and second etch stop liner layers, after the forming of the vertically oriented bit line.

13. The method of claim 7, further comprising:

replacing portions of the stack body with laterally oriented conductive lines, before the forming of the vertically oriented bit line.

14. The method of claim 13, wherein the laterally oriented conductive lines include a double word line.

15. The method of claim 7, further comprising:

replacing portions of the stack body with capacitors, after the forming of the vertically oriented bit line.

* * * * *